United States Patent [19]

Seifert

[11] Patent Number: 4,686,389
[45] Date of Patent: Aug. 11, 1987

[54] LOGIC FOR A PEAK VALUE STORE

[75] Inventor: Hans-Karl Seifert, Renningen, Fed. Rep. of Germany

[73] Assignee: TELEFUNKEN electronic GmbH, Heilbronn, Fed. Rep. of Germany

[21] Appl. No.: 715,023

[22] Filed: Mar. 22, 1985

[30] Foreign Application Priority Data

Mar. 30, 1984 [DE] Fed. Rep. of Germany ....... 3411828

[51] Int. Cl.$^4$ ............................................ H03K 5/153
[52] U.S. Cl. .................................... 307/351; 307/360; 328/151
[58] Field of Search ............... 307/351, 358, 360, 246; 328/151; 329/203, 205 R; 324/103 P

[56] References Cited

U.S. PATENT DOCUMENTS 4,370,620 1/1983 Tin ...................................... 307/358

Primary Examiner—John Zazworsky
Attorney, Agent, or Firm—Spencer & Frank

[57] ABSTRACT

The invention relates to a discharge monitoring circuit for a peak value store which detects and stores the voltage peaks of a periodic signal with varying amplitude in each period. If at the end of a period, the peak of the periodic signal to be stored, in relation to the peak of the immediately preceding period, is smaller by more than a defined settable percentage ratio, a correction circuit is activated to completely discharge, in this case, the store capacitor of the peak value store, so that the voltage at the store capacitor is again able to follow the peak values of the signal. A low-pass mean value generator connected downstream then produces an envelope for the peaks of the periodic signal.

9 Claims, 22 Drawing Figures

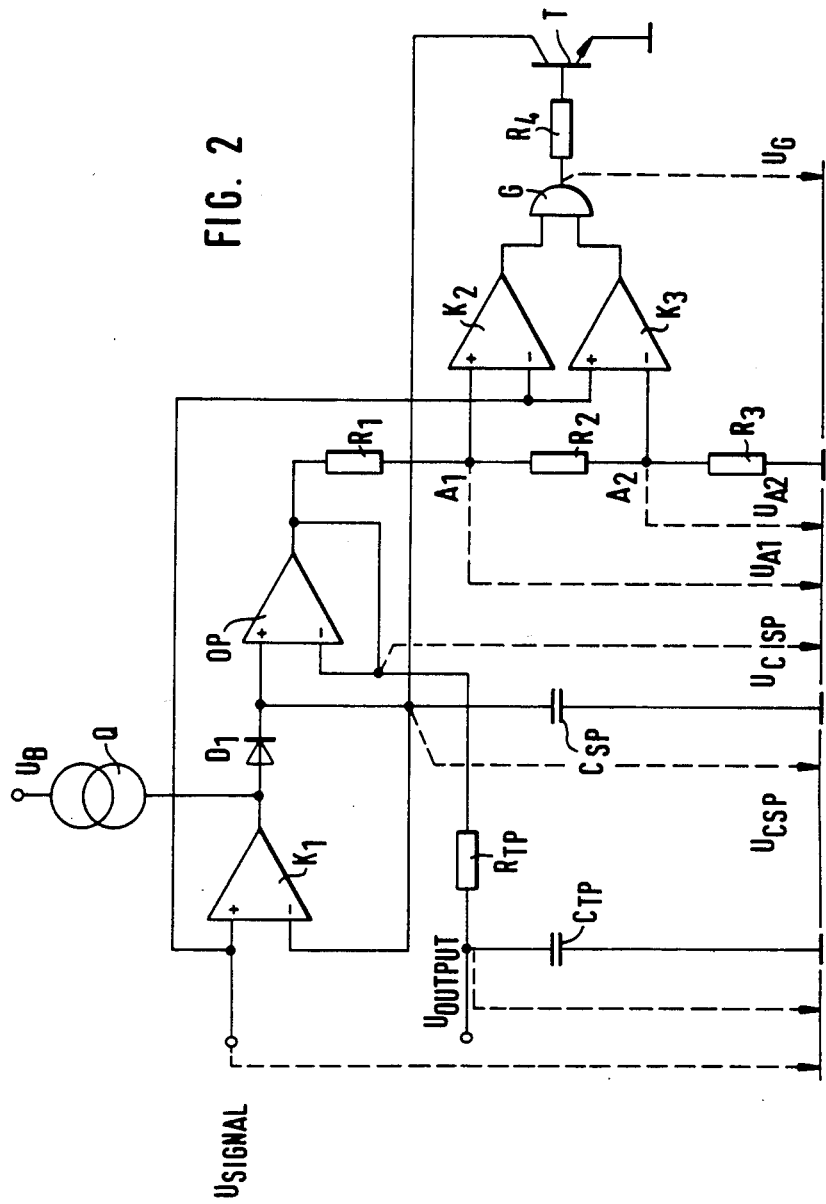

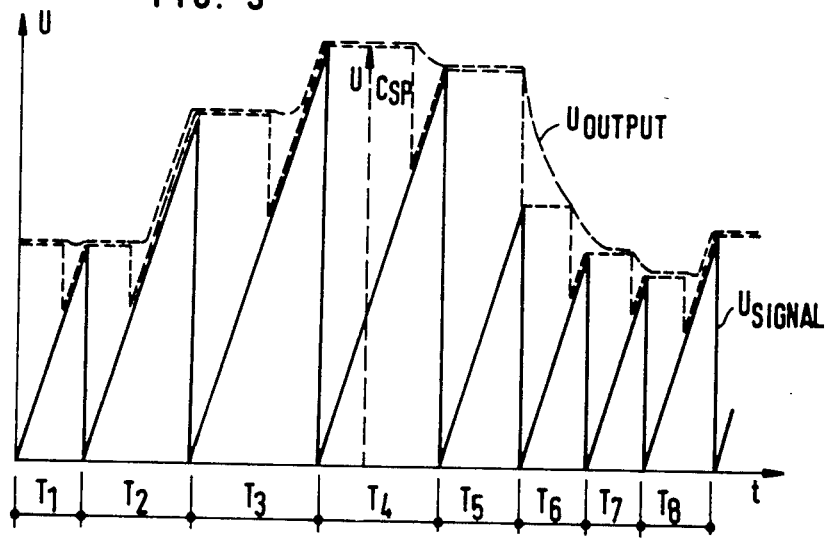
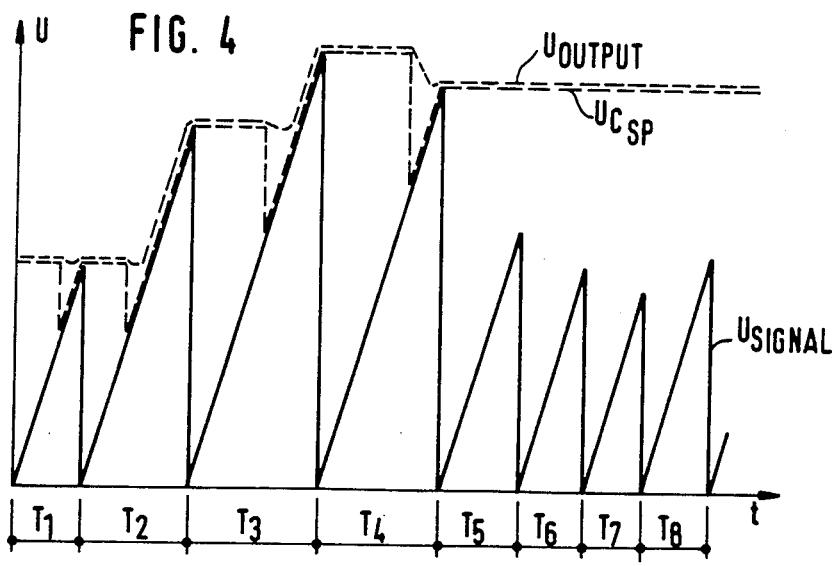

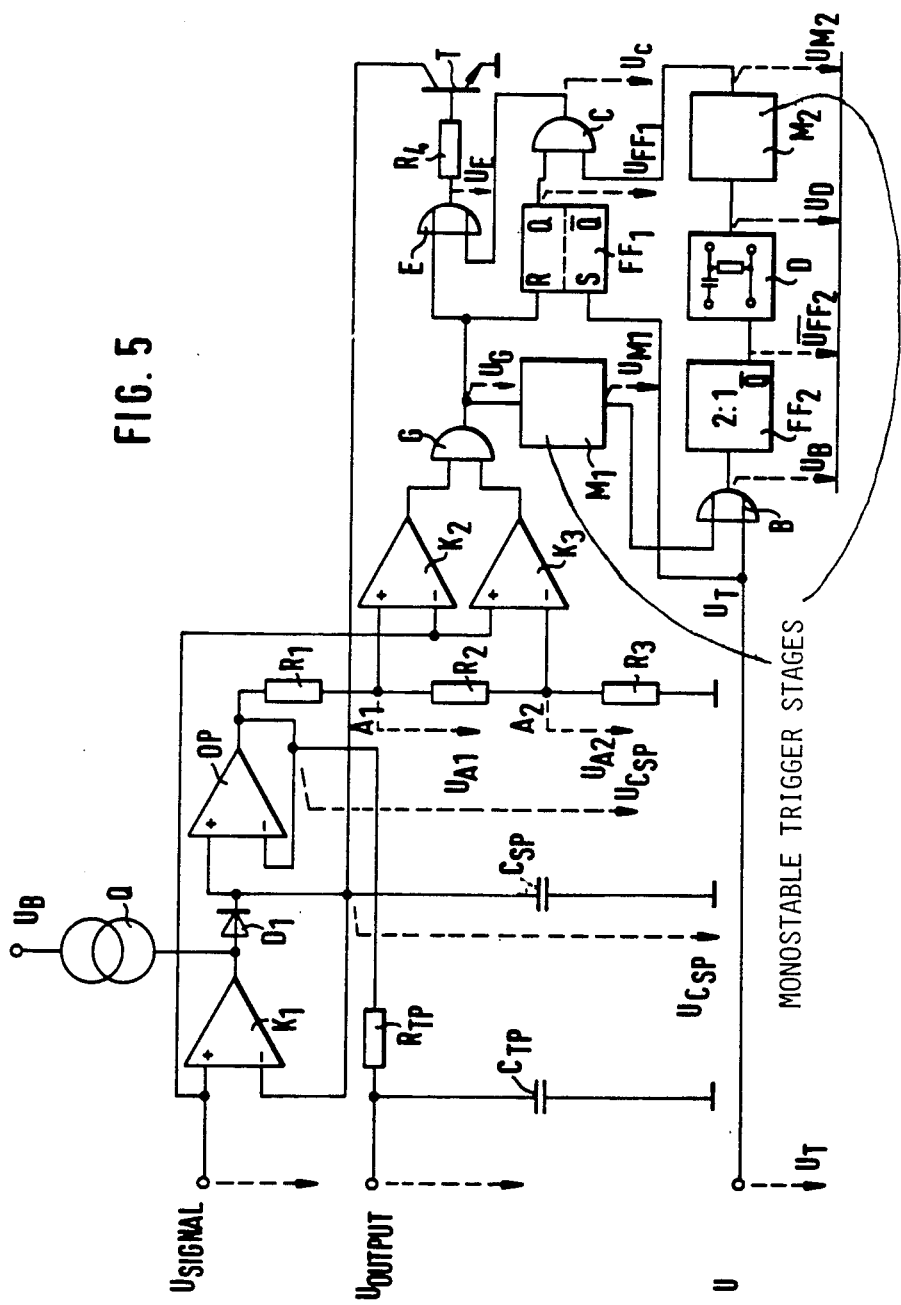

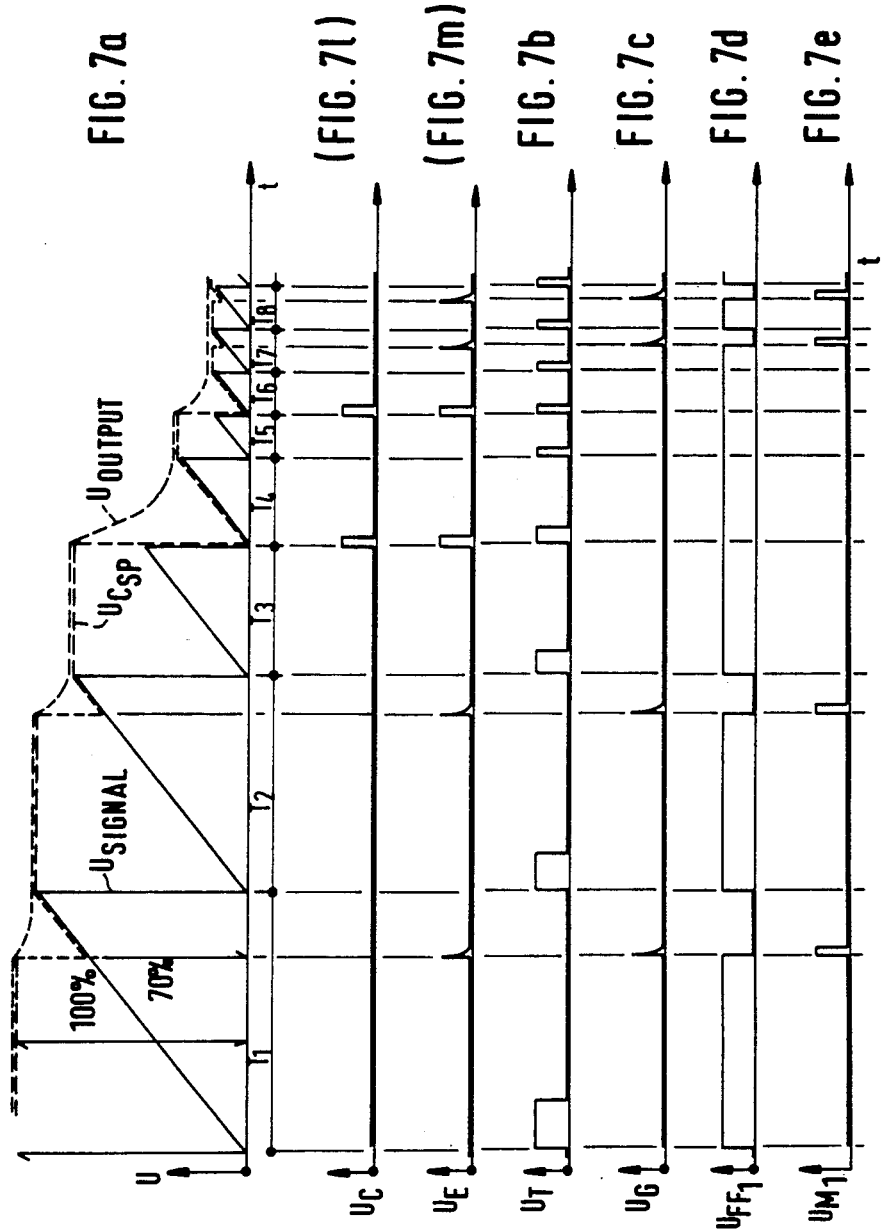

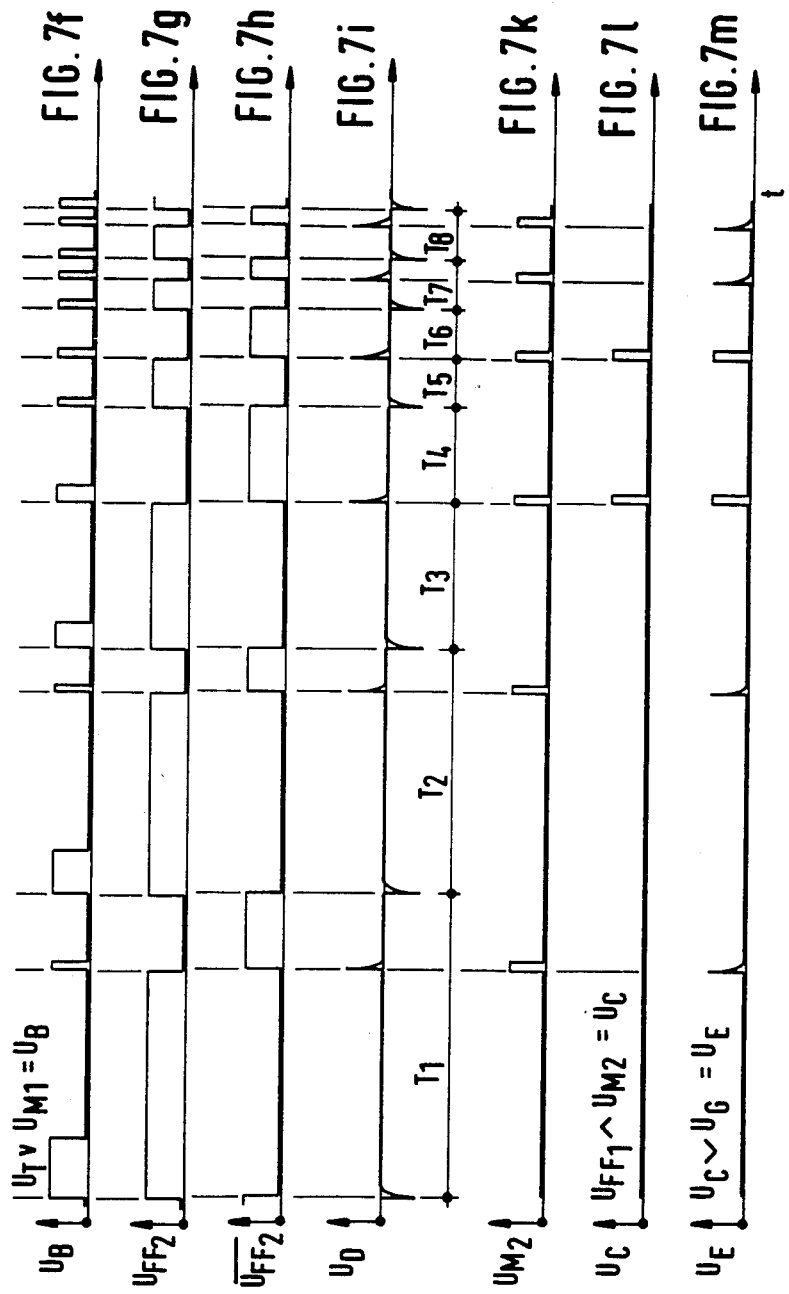

LOGIC FOR A PEAK VALUE STORE

BACKGROUND OF THE INVENTION

The invention relates to a discharge monitoring circuit for a store which stores the peak values of a periodic signal with varying amplitude, consisting of a store capacitor which is charged to the peak value of the signal in one period via a charging circuit, and which stores this peak value in the following period until the signal has reached a defined percentage value of the stored peak value as determined by a comparator circuit, in order to then be discharged to the instantaneous value of the signal with the aid of a discharge circuit.

Peak value stores for determining the voltage peaks of a periodic signal provide an analog voltage signal for processing within a measuring, controlling or regulating circuit. It is, for instance, possible to determine by measuring techniques rotational speeds using the output voltage of a low-pass mean value generator connected downstream from the peak value store, if the periodic signal is of saw-toothed configuration. Thus, certain controls which are dependent on rotational speed may be attained with the aid of comparator circuits. In other cases, it may prove necessary for an analog periodic signal which is to be regulated to always reach a constant peak value within each period so as to enable an analog actual value signal to be generated with the aid of a peak value store for determination of the respective peak and its processing in a regulating circuit.

Peak value stores in accordance with the state of the art operate according to the charging and discharging principle of a store capacitor which is charged to the current peak value of the signal of each period by a current source via a first comparator circuit and a diode, and stores this value in the following period until it is discharged to the instantaneous value of the signal via a further comparator circuit and a discharge transistor within the following period. The store capacitor is then charged again via the current source and the first comparator circuit to the voltage peak at the end of the following period.

This peak value store does, however, have the disadvantage that it can only store the peaks of the periodic signal to be stored if the percentage ratio of the peak of the instantaneous signal in relation to the peak value of the immediately preceding signal is not less than a certain value which can be set at the further comparator circuit. For reasons of compromise, this value may be approximately 70%. If this value is chosen very small, in order to enable the peak value store to follow again the dynamics of the voltage peaks, an unsatisfactory envelope curve signal is obtained at the output of the low-pass forming the mean value. If conditions during operation are such that the peak values of a period in relation to the peak value of the immediately preceding period are not below this settable value for quite a long time, the peak value store is operating correctly. If, on the other hand, the ratio of the immediately successive peak values of a periodic signal is smaller than this settable value even once, the voltage at the store capacitor is no longer able to follow the dynamics of the peak values of the periodic signal. The store capacitor then keeps its voltage at a constant value.

SUMMARY OF THE INVENTION

The object underlying the present invention is therefore to indicate a discharge monitoring circuit for a peak value store, wherein the store capacitor is only completely discharged at the end of a period if the percentage ratio of the peak values of two immediately successive periodic signals is less than a settable value, and wherein directly after its discharge, the store capacitor is immediately charged again by the charging circuit to the respective peak value of the following period.

This object is attained in accordance with the invention by providing circuit means which ensure that in cases where the signal does not reach the predetermined percentage value of the instantaneously stored peak value, the store capacitor is discharged at the end of the period, ensuring that the voltage at the store capacitor is then again able to follow the peak values of the signal. In a favorable further development, this may be effected by the discharge transistor (T) being triggered via an OR gate with one of its inputs being fed needle pulses regulated in their pulse width via the further comparator circuit within a period when the periodic signal has just reached the predetermined percentage value of the immediately preceding peak value of the signal, and with the other input of the OR gate being fed pulses of constant pulse width, controlled in their pulse width, at the end of a period, when the signal does not reach the predetermined percentage value of the peak value of the immediately preceding signal. These pulses are generated in a digital network consisting of a first monostable trigger stage, a further OR gate, a frequency divider stage, a differentiating member, a second monostable trigger stage, a bistable trigger stage and an AND gate. The discharge monitoring circuit according to the invention for a peak value store has the advantage that the voltage path at the store capacitor is always able to follow the peak of a periodic signal to be stored even in the event of maximum dynamic variations, and that an optimally adapted envelope curve may be formed in a low-pass member forming a mean value. It is thus possible to determine and evaluate the peaks of a periodic signal for measuring, controlling and regulating operations.

Further embodiments of the invention are to be found in the subclaims.

BRIEF DESCRIPTION OF THE DRAWINGS

Embodiments of the invention are illustrated in the drawings and shall now be described in greater detail:

FIG. 2 shows a peak value store according to the state of the art as a block circuit diagram;

FIG. 3 shows the path of the voltage of the periodic signal, the time sequence of the voltage at the store capacitor of the peak value store, and the path of the voltage at the capacitor of the low-pass RC member in the circuit according to FIG. 2;

FIG. 4 shows the time sequence of the periodic signal wherein the voltage at the store capacitor of the peak value store and also the output voltage at the low-pass RC member in the circuit according to FIG. 2 can no longer follow the dynamics of the peak values unconditionally;

FIG. 5 shows the peak value store and also a discharge monitoring circuit for a peak value store according to the invention;

FIGS. 7a–7m show the pulse diagrams of the discharge monitoring circuit according to FIG. 5;

DESCRIPTION OF THE PREFERRED EMBODIMENTS

Figure 1A:
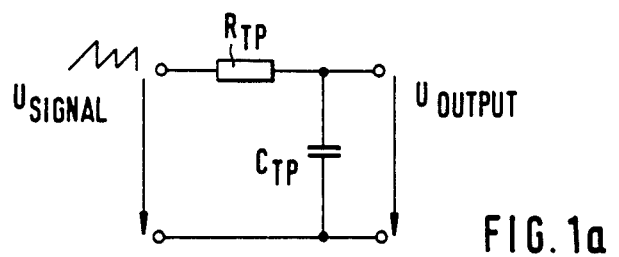
FIGS. 1a and 1b show the time sequence of a periodic signal which varies in its peak value at the input of a low-pass RC member, and the path of the output voltage at this RC member.
Figure 1B:
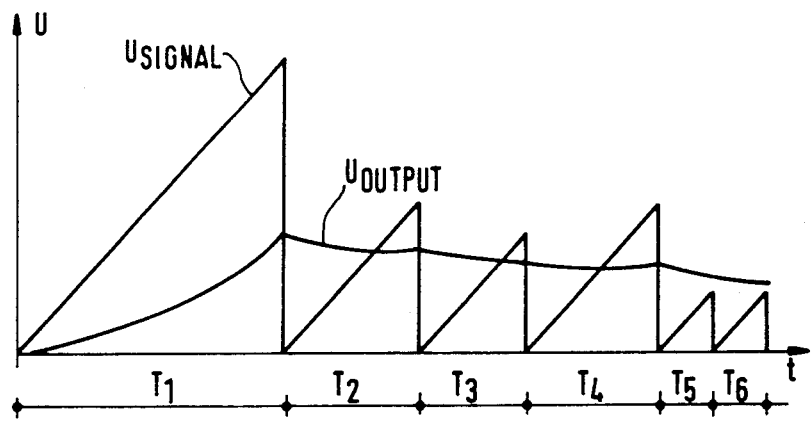

A simple low-pass RC member according to FIG. 1a is not suitable for storing the peak of a periodic signal within each period. Measurements and calculations indicate that the output voltage according to FIG. 1b at the low-pass RC member is not able to follow the dynamics of, for example, a saw-toothed signal according to FIG. 1b for determining the respective peak values. Peak value stores, according to the block circuit diagram in FIG. 2 operate according to the charging and discharging principle of a store capacitor $C_{Sp}$ which is charged by a charging circuit consisting of a current source Q, a diode $D_1$ and a comparator $K_1$. The charging operation lasts until the signal has reached its peak value. The periodic signal fed to the positive input, and the voltage at the store capacitor $C_{Sp}$ fed to the negative input of $K_1$ are compared to each other in the comparator $K_1$, and its output prevents the charging operation at the store capacitor when the periodic signal is smaller than the stored voltage at the store capacitor. To ensure that the store capacitor cannot discharge itself via the output of the comparator $K_1$, there is connected between the output of the comparator $K_1$, to which also the one terminal of the current source Q is connected, and the store capacitor a diode $D_1$, more particularly, in such a way that its cathode is connected to the one voltage conducting terminal of the store capacitor $C_{Sp}$ whose other terminal is connected to ground potential. The voltage at the store capacitor $C_{Sp}$ is connected to the positive pole of a non-inverting operational amplifier OP whose negative input is coupled back to its output. The output voltage of the operational amplifier OP is as large as the voltage at the store capacitor $U_{C_{Sp}}$ and feeds a voltage divider consisting of the three resistances $R_1$, $R_2$, and $R_3$ with the voltage divider taps $A_1$ and $A_2$ and also the pertaining voltages $U_{A1}$ and $U_{A2}$. The output of the operational amplifier is furthermore connected to the one terminal of the resistance $R_{TP}$ of a low-pass RC member whose other terminal is connected to the capacitor $C_{TP}$ determining the time constant, with the other terminal of the latter being connected to ground potential.

The other terminal of the resistance $R_{TP}$ simultaneously serves as the output of the low-pass RC member. The voltage divider tap $A_1$ is fed to the positive input of a second comparator $K_2$ and the voltage divider tap $A_2$ is fed to the negative input of a third comparator $K_3$. The periodic signal is fed to the negative input of the second and to the positive input of the third comparator. The outputs of the comparators $K_2$ and $K_3$ are each connected to one input of an AND gate G whose output voltage $U_G$ drives via a resistance $R_4$ a discharge transistor T whose collector is connected directly to the voltage conducting terminal of the store capacitor $C_{Sp}$. The emitter of the discharge transistor is connected to ground potential.

If the voltage at the store capacitor $C_{Sp}$ is equal to the voltage peak value of the periodic signal at the end of a period, the charging operation at the store capacitor $C_{Sp}$ is interrupted via the comparator $K_1$. The voltage of the store capacitor $C_{Sp}$ is then connected with stepped percentage values to the positive input of the comparator $K_2$ via the voltage divider tap $A_1$ and to the negative input of the comparator $K_3$ via the voltage divider tap $A_2$. If the periodic signal in the following period is smaller than the voltage at the tap $A_1$ and greater than that at the voltage divider tap $A_2$, a high level is then generated at the output of the AND gate G and drives the discharge transistor T. The latter now discharges the store capacitor $C_{Sp}$. The duration of the discharge operation is regulated during this operation. The voltage at the store capacitor decreases very rapidly owing to the discharge operation. Its instantaneous voltage $U_{C_{Sp}}$ is also connected via the operational amplifier OP to the voltage divider $R_1$, $R_2$ and $R_3$. After a relatively short time, the voltage $U_{A1}$ at the voltage divider tap $A_1$ thus becomes smaller than the instantaneous signal voltage, whereby the comparator output of $K_2$ arrives at a logical low level, and the output of the AND gate G is therefore likewise at a logical low level. The discharge transistor T is blocked. It is therefore driven in this way by discharge pulses whose pulse width is regulated, so that the store capacitor $C_{Sp}$ is discharged only to the instantaneous value of the periodic signal within one period. The output of the comparator $K_1$ then releases the current source for charging the store capacitor $C_{Sp}$ again for storage of the new peak value.

The sequence of the periodic signal and also the voltage path $U_{C_{Sp}}$ at the store capacitor and at the output of the low-pass RC member are shown in FIG. 3. The case has been assumed where the voltage at the peak value store in its 5th period is just still able to follow the dynamics of the voltage peak of the periodic signal.

Now if in the following period, the periodic signal remains smaller than the voltage value at the voltage divider tap $A_2$, the output of the comparator $k_3$ is at a logical low level and likewise the output of the AND gate G. The discharge transistor T is therefore not driven and the store capacitor $C_{Sp}$ retains its voltage value constantly and is no longer able to follow the current peak value of the periodic signal.

This case is presented in FIG. 4. From the 5th period on, the voltage at the store capacitor is no longer able to follow the dynamics of the voltage peaks of the periodic signal.

In order to avoid this, a discharge monitoring circuit according to FIG. 5 which does not have this decisive disadvantage has been developed for a peak value store.

Figure 6:
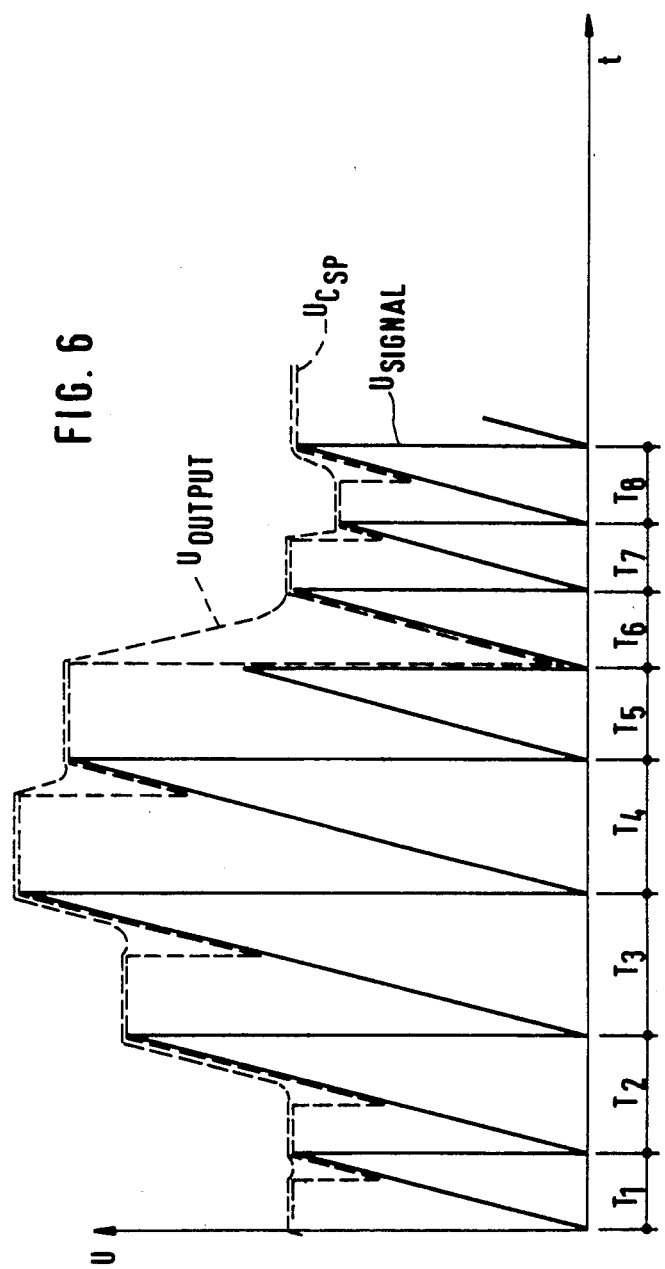
FIG. 6 shows the time sequence of the periodic signal according to FIG. 4 and also the path of the voltage at the store capacitor $C_{Sp}$ of the peak value store, as well as the output voltage at the capacitor of the low-pass RC member when a circuit according to FIG. 5 is used, with the voltage at the store capacitor $C_{Sp}$ again being able to follow the dynamics of the peak values of the periodic signal by means of the discharge monitoring circuit.

In FIG. 6, its mode of operation is shown in principle for the case where the periodic signal has the same sequence as in FIG. 4. The discharge monitoring circuit ensures that the discharge transistor T is now fed at the end of the 5th period a pulse whose pulse width is controlled, and which almost completely discharges the store capacitor $C_{Sp}$, after which the store capacitor is again charged to the peak value of the periodic signal, and the voltage at the store capacitor can now follow the dynamics of the peak values of the periodic signal again.

The discharge monitoring circuit according to FIG. 5 consists of a monostable trigger stage $M_1$, an OR gate B, a frequency divider stage $FF_2$ with the divider ratio of 2:1, a differentiating member D, a further monostable trigger stage $M_2$, an AND gate C, a bistable trigger stage $FF_1$ and a further OR gate E.

The output pulses $U_G$, regulated in their pulse width, of the AND gate G are fed to a monostable trigger stage $M_1$ where they are widened to pulses of a constant pulse width. The output pulses $U_{M1}$ of the monostable trigger stage $M_1$ are fed together with the input clock signal $U_T$ which determines the period, to one input each of the OR gate B. Its output pulses $U_B$ control a frequency divider stage $FF_2$ with the divider ratio of 2:1. The output signal $U_{FF2}$ of the frequency divider stage $FF_2$ is fed to a differentiating member D, with only its positive output pulses contracting the monostable trigger stage $M_2$ connected downstream, so that pulses of constant pulse width are generated at its output. These pulses $U_{M2}$ are fed to the one input of a further AND gate C. The input clock signal $U_T$ is also fed to the setting input S of a bistable trigger stage $FF_1$ whose resetting input R is driven by the output signal of the AND gate G. The output signal $U_{FF1}$ of the bistable trigger stage is fed to the other input of the AND gate C. Its output signal $U_C$ drives the one input of an OR gate E whose other input is driven by the output signal $U_G$ of the AND gate G. The output signal $U_E$ of the OR gate E drives via the resistance $R_4$ the discharge transistor T. The latter is thereby driven by pulses controlled or regulated in their pulse width, as required on account of the dynamics of the peak values of the periodic signal.

In FIG. 7, the pulse diagrams relating to the block circuit diagram in FIG. 5 are displayed.

FIG. 7a shows the voltage path of an assumed periodic signal, the path of the voltage at the store capacitor $C_{SP}$ and also the output voltage path at the low-pass RC member.

FIG. 7b shows the sequence of the input clock signal.

FIG. 7c shows the sequence of the needle pulses $U_G$, whose pulse width is regulated, at the output of the AND gate G. In the third and the fifth periods these pulses cannot be formed in the peak value store according to the state of the art.

The input clock signal $U_T$ sets a bistable trigger stage $FF_1$ with its LOW/HIGH edge, and it is reset by means of the output pulse $U_G$ of the AND gate G.

FIG. 7d shows the output signal of the bistable trigger stage $U_{FF1}$.

FIG. 7e shows the output pulses of the monostable trigger stage $M_1$, whose pulse width is constant, and which are obtained from the output pulses $U_G$ of the AND gate G.

In the OR gate B, the input clock signal $U_T$ and the output signal $U_{M1}$ of the monostable trigger stage $M_1$ are linked to each other, whose output signal $U_B$ is shown in FIG. 7f.

In the frequency divider stage $FF_2$ connected downstream with the frequency divider ratio of 2:1, there is formed from the output signal $U_B$ of the OR gate B, the output signal $U_{FF2}$ whose sequence is shown in FIG. 7g.

The output signal $\overline{U_{FF2}}$ complementary with $U_{FF2}$ is also connected to this frequency divider stage, as shown in FIG. 7h.

This signal is fed to a differentiating high-pass RC member D whose output signal $U_D$ is shown in FIG. 7i. Only its positive needle pulses hit a futher monostable trigger stage $M_2$ whose output pulses $U_{M2}$ are shown in FIG. 7k.

Linking these output pulses $U_{M2}$ and the output pulses $U_{FF1}$ of the bistable trigger stage $FF_1$ in a further AND member C results at its output in the pulses $U_C$ according to FIG. 7l.

From the presentation it is apparent that these pulses whose pulse width is controlled are generated at the end of the third and fifth periods only, i.e., where the store capacitor $C_{SP}$ is to be almost completely discharged in order to be able to follow the dynamics of the peak values of the periodic signal again. The output pulses $U_G$ of the AND gate G are fed to one input each of a further OR GATE E whose output signal $U_E$ is shown in FIG. 7m. This output signal of the further OR gate E is fed to the base of the discharge transistor T via the resistance $R_4$, whereby the store capacitor $C_{Sp}$ is discharged within a period to the instantaneous value of the periodic signal if the driving pulses at the base of the discharge transistor T are regulated in their pulse width, and the store capacitor $C_{Sp}$ is almost completely discharged at the end of a period if the driving pulses are controlled in their pulse width at the base of T.

Figure 8:
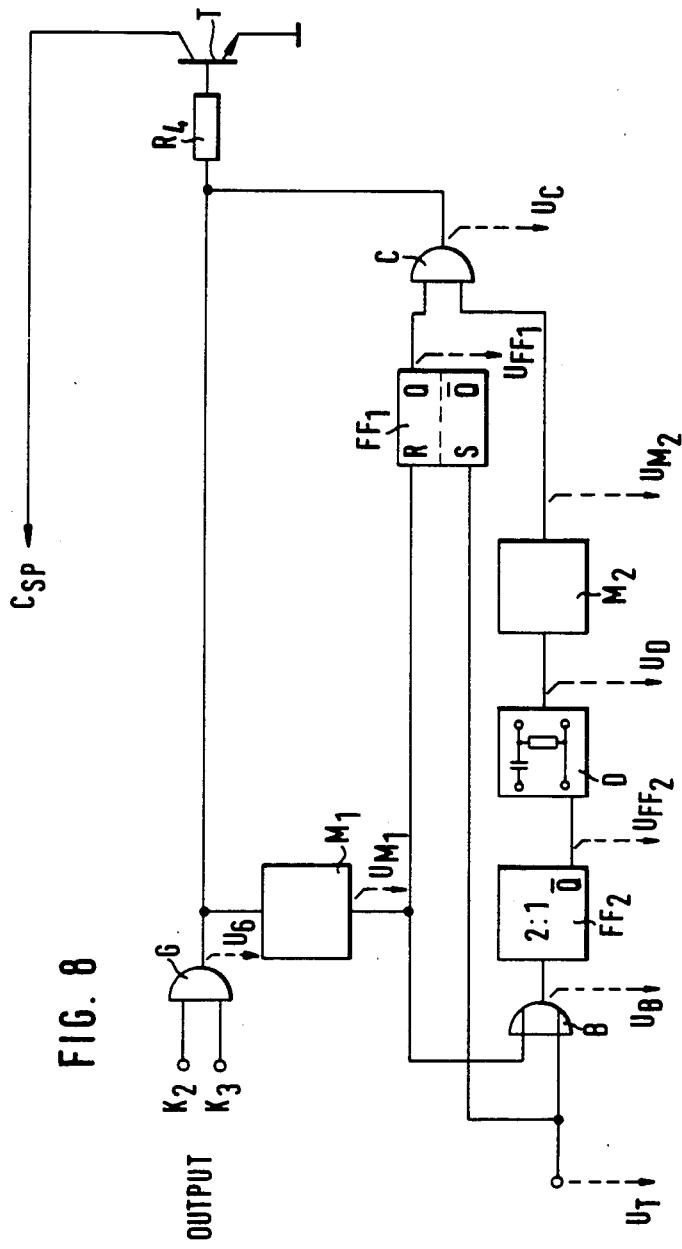
FIG. 8 shows a modified block circuit diagram of the discharge monitoring circuit according to FIG. 5.

According to FIG. 8, the further OR gate E may also, under certain circumstances, be omitted, and the outputs of the AND gate G and of the further AND gate C are simply connected to each other and then drive the base of the discharge transistor T. The output signal of the monostable trigger stage $M_1$ may also be used for driving the resetting input R of the bistable trigger stage $FF_1$.

FIG. 8 shows a block circuit diagram for a circuit of this modification.

The discharge monitoring circuit may be realized by means of commercially available components. A total integration of the peak value store according to the state of the art and the discharge monitoring circuit is, however, also possible.

What is claimed is:

1. Discharge monitoring circuit for a store which stores the peak values of a periodic signal with varying amplitude, the store comprising: a store capacitor ($C_{Sp}$) which is charged to the peak value of the signal in one period via a charging circuit (Q, $D_1$, $K_1$) and which stores this peak value in the following period until the signal has reached a defined percentage value of the stored peak value as determined by a comparator circuit (OP, $R_1$, $R_2$, $R_3$, $K_2$, $K_3$, G), in order to then be discharged to the instantaneous value of the signal with the aid of a discharge circuit ($R_4$, T), wherein said discharge monitoring circuit comprises circuit means ($M_1$, B, $FF_2$, D, $M_2$, C, $FF_1$, E) by means of which the store capacitor ($C_{Sp}$) is discharged at least almost to ground potential at the end of the period in cases where the signal does not reach the predetermined percentage value of the instantaneously stored peak value, so that the voltage at the store capacitor ($C_{Sp}$) is again able to follow the peak values of the signal, and wherein the store capacitor ($C_{Sp}$) is discharged to the instantaneous voltage value of the signal to be stored within one period when the discharge transistor (T) is driven by needle pulses which are regulated in their pulse width, and in that the store capacitor ($C_{Sp}$) is discharged almost to ground potential at the end of each period when the discharge transistor (T) of the discharge circuit is driven by pulses which are controlled in their pulse width.

2. Discharge monitoring circuit for a store according to claim 1, characterized in that the voltage of the store capacitor ($C_{Sp}$) at the output of an operational amplifier (OP) is fed to a low-pass RC member ($C_{TP}$, $R_{TP}$).

3. Discharge monitoring circuit for a store which stores the peak values of a periodic signal with varying amplitude, the store comprising: a store capacitor ($C_{Sp}$) which is charged to the peak value of the signal in one period via a charging circuit (Q, $D_1$, $K_1$) and which stores this peak value in the following period until the signal has reached a defined percentage value of the stored peak value as determined by a comparator circuit (OP, $R_1$, $R_2$, $R_3$, $K_2$, $K_3$, G), in order to then be discharged to the instantaneous value of the signal with the aid of a discharge circuit ($R_4$, T), wherein said discharge monitoring circuit comprises circuit means ($M_1$, B, $FF_2$, D, $M_2$, C, $FF_1$, E) by means of which the store capacitor ($C_{Sp}$) is discharged at least almost to ground potential at the end of the period in cases where the signal does not reach the predetermined percentage value of the instantaneously stored peak value, so that the voltage at the store capacitor ($C_{Sp}$) is again able to follow the peak values of the signal, the discharge circuit is driven by digital pulses which are controlled or regulated in their pulse width, the discharge transistor (T) of the discharge circuit is driven via an OR gate (E) by needle pulses regulated in their pulse width only when the signal $U_C$ of the circuit means ($M_1$, B, $FF_2$, D, $M_2$, $FF_1$, C) is at low potential, and the discharge transistor (T) is driven via the OR gate (E) by pulses controlled in their pulse width only when the output signal $U_G$ of the comparator circuit ($OP_1$, $R_1$, $R_2$, $R_3$, $K_2$, $K_3$, G) is at low potential.

4. Discharge monitoring circuit for a store according to claim 3, characterized in that a monostable trigger stage ($M_1$) which generates pulses of constant pulse width is connected to the output of an AND gate (G) in order to widen the output pulses of the comparator circuit ($OP_1$, $R_1$, $R_2$, $K_2$, $K_3$, G).

5. Discharge monitoring circuit for a store according to claim 4, characterized in that the output signal $U_{M1}$ of the monostable trigger stage ($M_1$) and the input clock signal $U_T$ generated by a clock pulse generator and determining the signal periods are fed to a further OR gate (B).

6. Discharge monitoring circuit for a store according to claim 5, characterized in that the output signal $U_B$ of the further OR gate (B) is fed to a frequency divider stage $FF_2$ whose output signal $U_{FF2}$ is fed to a differentiating member (D), so that the needle pulses occurring at the output of the differentiating member serve to drive a second monostable trigger stage ($M_2$) which is connected downstream.

7. Discharge monitoring circuit for a store according to claim 6, characterized in that the output signal $U_{M2}$ of the second monostable trigger stage ($M_2$) drives an input of a further AND gate (C).

8. Discharge monitoring circuit for a store according to claim 5, characterized in that the input clock signal $U_T$ drives the setting input of a bistable trigger stage ($FF_1$) whose resetting input is driven by the output voltage $U_G$ of an AND gate (G), and in that the output signal $U_{FF1}$ of the bisstable trigger stage ($FF_1$) is fed to the other input of a further AND gate (C) whose output is connected to the one input of the OR gate (E).

9. Discharge monitoring circuit for a store according to claim 4, characterized in that the output of the AND gate (G) is connected to the other input of the OR gate (E).

* * * * *